(12) United States Patent
Hirler

(10) Patent No.: US 6,576,953 B2
(45) Date of Patent: Jun. 10, 2003

(54) VERTICAL SEMICONDUCTOR COMPONENT WITH SOURCE-DOWN DESIGN AND CORRESPONDING FABRICATION METHOD

(75) Inventor: Franz Hirler, Isen (DE)

(73) Assignee: Infineon Technologies AG, Munich (DE)

( * ) Notice: Subject to any disclaimer, the term of this patent is extended or adjusted under 35 U.S.C. 154(b) by 3 days.

(21) Appl. No.: 09/768,015

(22) Filed: Jan. 23, 2001

(65) Prior Publication Data

US 2002/0135008 A1 Sep. 26, 2002

(30) Foreign Application Priority Data

Feb. 4, 2000 (DE) .......................... 100 04 984

(51) Int. Cl.⁷ .......................... H01L 29/76; H01L 29/94; H01L 31/062; H01L 31/113
(52) U.S. Cl. .................. 257/329; 257/330; 257/331; 257/341
(58) Field of Search ................................ 257/329, 330, 257/331, 341

(56) References Cited

U.S. PATENT DOCUMENTS

| | | | |
|---|---|---|---|
| 5,945,708 A | * | 8/1999 | Tihanyi ........................ 257/331 |
| 6,124,612 A | * | 9/2000 | Tihanyi et al. ............... 257/330 |
| 6,373,097 B1 | * | 4/2002 | Werner ........................ 257/329 |

FOREIGN PATENT DOCUMENTS

| | | | |
|---|---|---|---|
| DE | 196 38 439 C2 | 9/1996 | ................. 257/341 |
| EP | 0 440 394 A2 | 7/1991 | ................. 257/330 |
| EP | 0 833 392 A2 | 7/1997 | ................. 257/330 |
| JP | 08-308140 | * 11/1996 | ................. 257/329 |
| WO | WO 99/36964 | 7/1999 | ................. 257/330 |

OTHER PUBLICATIONS

European Search Report.

* cited by examiner

*Primary Examiner*—Steven Loke
(74) *Attorney, Agent, or Firm*—Welsh & Katz, Ltd.

(57) ABSTRACT

The present invention provides a semiconductor component having a substrate (10) of a first conduction type (n⁺); provided on the substrate (10), an optional first layer (20) of the second conduction type (p⁺) as body connection region; provided on the first layer (20) or the substrate (10), a second layer (30) of the second conduction type (p) as body region; provided on the second layer (30), a third layer (40) of the first conduction type (n) as drain region; a trench (140) reaching down to the substrate (10); a gate structure (90, 100) provided in the trench (140); and a source region (130) of the first conduction type (n⁺), said source region being provided in the second layer (30) in the periphery of the trench (140); the source region (130) being short-circuited with the first layer (20) and the substrate (10) by a conductive layer (120) provided in the lower region of the trench.

5 Claims, 4 Drawing Sheets

Figure 1:
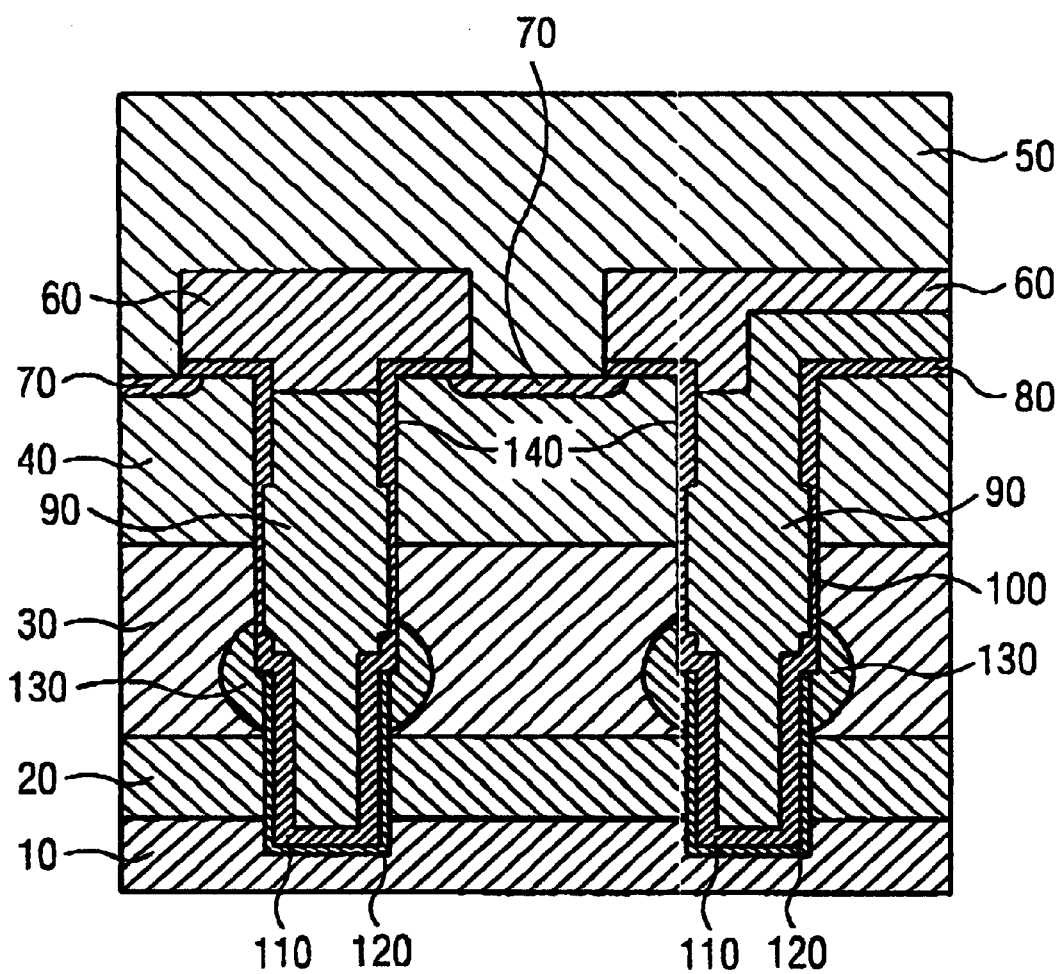

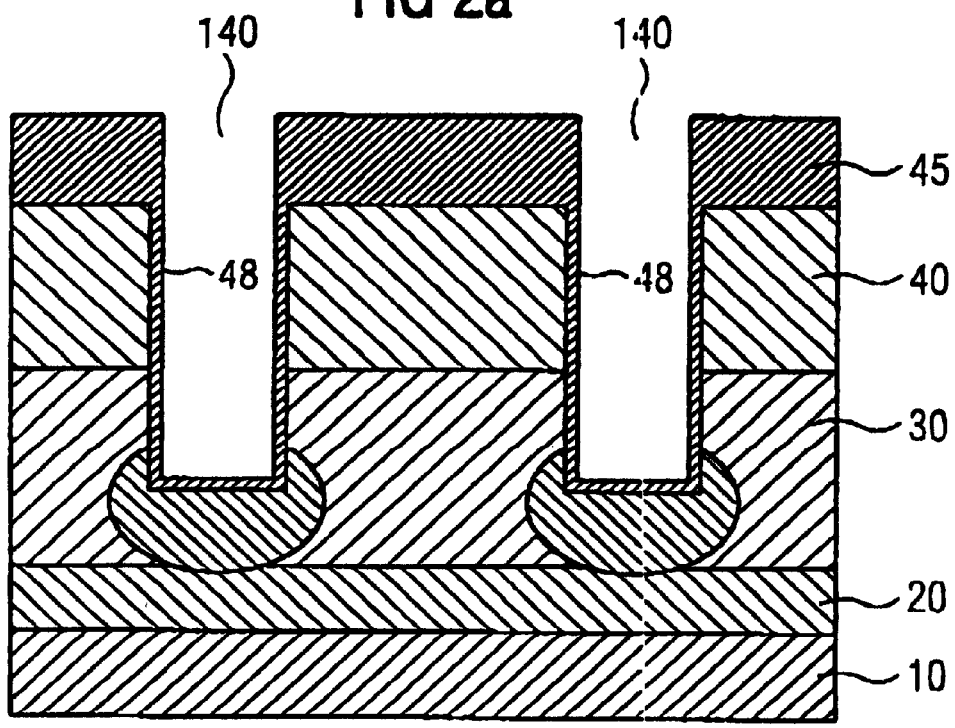
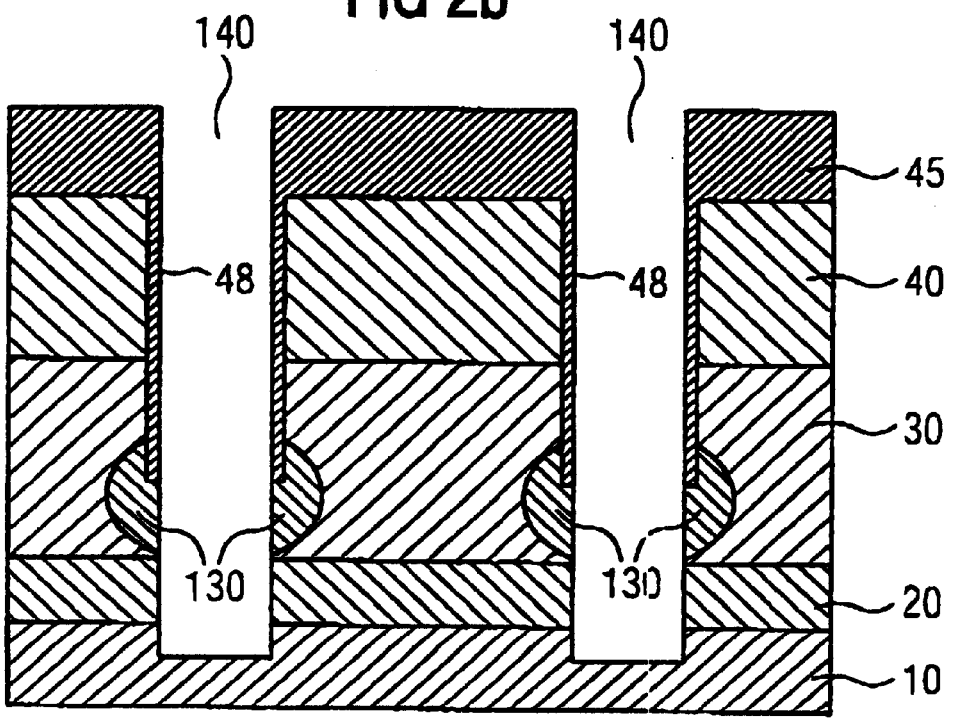

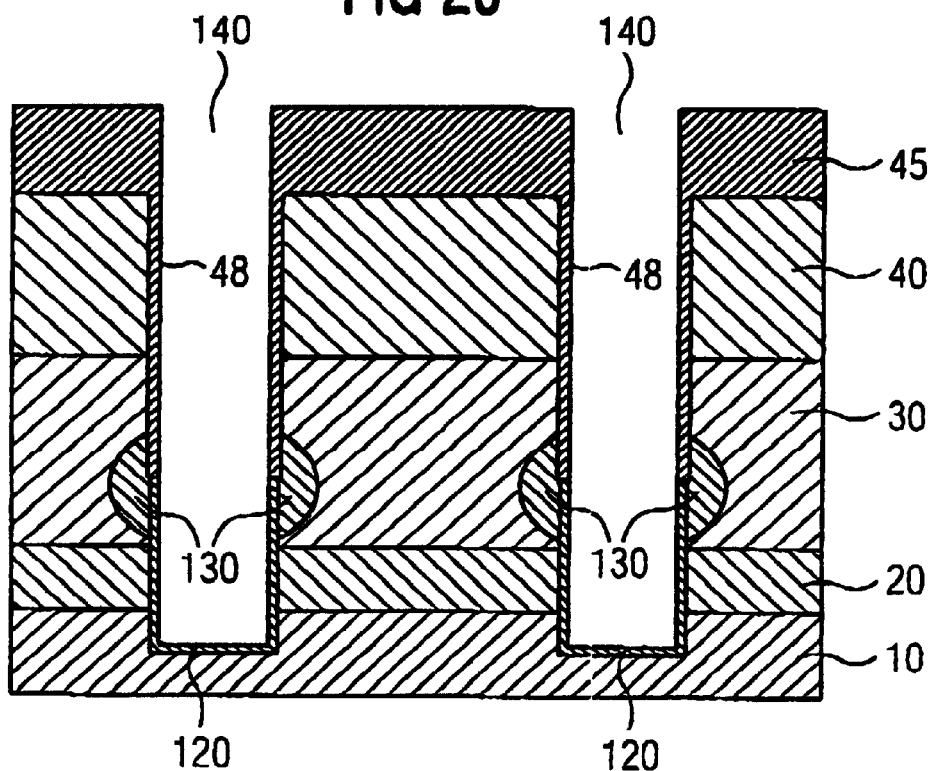
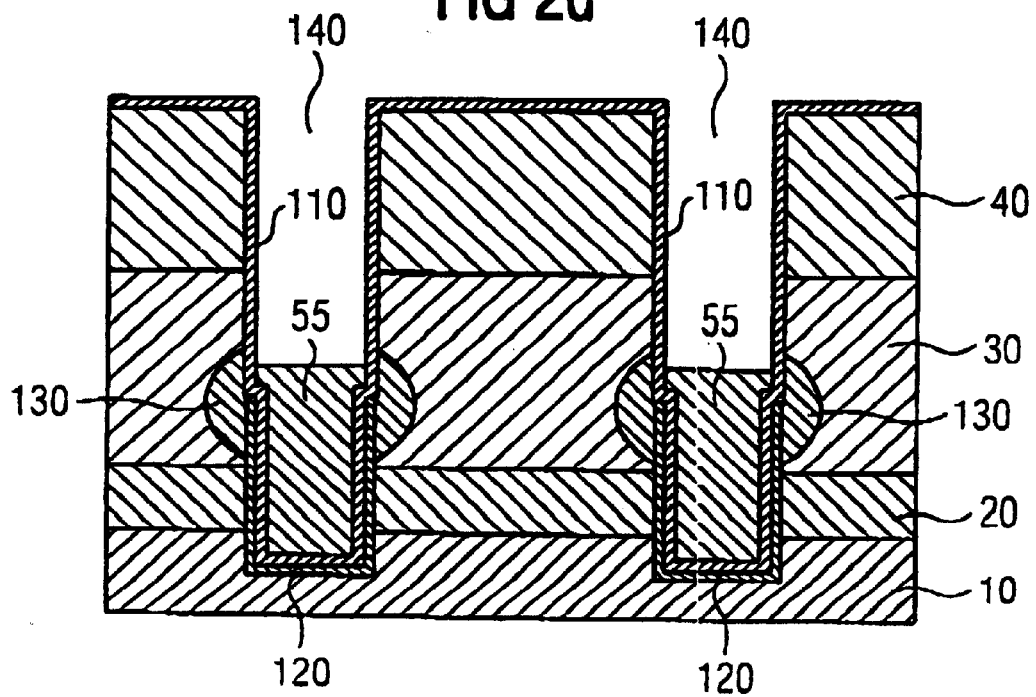

US 6,576,953 B2

VERTICAL SEMICONDUCTOR COMPONENT WITH SOURCE-DOWN DESIGN AND CORRESPONDING FABRICATION METHOD

DESCRIPTION

The present invention relates to a vertical semiconductor component with source-down design and a corresponding fabrication method.

DE 196 38 439 A1 discloses a field effect-controllable, vertical semiconductor component, comprising a semiconductor body with at least one drain region of the first conduction type, at least one source region of the first conduction type, at least one body region of the second conduction type between drain region and source region, and at least one gate electrode which is insulated from the entire semiconductor body by a gate oxide, the gate terminal and drain terminal being situated on the front side of the wafer and the source terminal being situated on the rear side of the wafer.

Although applicable to any semiconductor components, he present invention and the problems on which it is based will be explained with regard to vertical source-down power transistors.

Source-down power transistors in the form of individual switches and in the form of integrated multiple switches (with common source=common source terminal) afford advantages of a circuitry and thermal nature.

One problem in their fabrication is that the source region and the body region, which are buried in the silicon, must be short-circuited to ensure that the parasitic bipolar transistor does not switch on.

It is an object of the present invention, therefore, to provide a semiconductor component of the type mentioned in the introduction in which the short circuit between source region and body region can be fabricated favorably in terms of process engineering. A further object is to provide a corresponding fabrication method.

According to the invention, this object is achieved by means of the semiconductor component specified in claim 1 and, respectively, by means of the fabrication method specified in claim 6.

The idea underlying the present invention consists in realizing the semiconductor component as a trench component, the trench containing the gate electrode. The short circuit between body region and source region is realized in the lower region of the trench, in which case, instead of the substrate, an additional, preferably implanted region serves as source region which is short-circuited with the substrate and the body region, for example via a silicide.

In this case, it is expedient to provide a process sequence which produces insulation of the gate from the short circuit between body region and source region and also thicker insulation in the upper part of the trench with respect to the insulation between drain and gate.

One advantage of the configuration according to the invention is that the short circuit between body region and source region is realized in a space-saving manner in the lower region of the trench.

Advantageous developments and improvements of the semiconductor component specified in claim 1 and, respectively, of the fabrication method specified in claim 6 may be found in the subclaims.

In accordance with a preferred development, at least one of the first, second and third layers (20, 30, 40 is an epitaxial layer.

In accordance with a further preferred development, the source region (130) is an implantation region.

In accordance with a further preferred development, the conductive layer (120) is a silicide layer.

In accordance with a further preferred development, the silicide layer is produced by depositing a metal, preferably tungsten, in the trench and thermal siliciding.

In accordance with a further preferred development, the first conduction type is the n conduction type.

In accordance with a further preferred development, the second layer (30) is formed by implantation into the bottom of the trench and outdiffusion prior to the source implantation.

Exemplary embodiments of the invention are illustrated in the drawings and explained in more detail in the description below.

In the figures:

FIG. 1 shows a schematic illustration of a semiconductor component as an embodiment of the present invention; and FIGS. 2 a–e show a schematic illustration of the essential method steps for fabricating the semiconductor component according to FIG. 1.

In the figures, identical reference symbols designate identical or functionally identical elements.

FIG. 1 is a schematic illustration of a semiconductor component as an embodiment of the present invention.

In FIG. 1, 10 designates an $n^+$-type substrate, 20 designates a $p^+$-type epitaxial layer (body terminal), 30 designates a p-type epitaxial layer (body), 40 designates an n-type epitaxial layer (drain), 50 designates a drain terminal, 60 designates an insulation region, 70 designates a drain contact, 80 designations a first insulation layer, 90 designates a gate, 100 designates a gate oxide, 110 designates a second insulation layer, 120 designates a silicide region, 130 designates a source region and 140 designates a trench.

This embodiment is a source-down power transistor with a substrate of the $n^+$ conduction type.

A first, second and third epitaxial layer 20, 30, 40 are provided on the $n^+$-type substrate 10, namely the first layer 20 of the $p^+$ conduction type on the substrate 10 as body terminal region, the second layer 30 of the p conduction type on the first layer 20 as body region, and the third layer 40 of the n conduction type on he second layer 30 as drain region.

The trench 140 reaching down to the substrate 10 contains a gate structure 90, 100 with a gate 90 and a gate oxide 100, the gate 90 being insulated from its surroundings by the insulation layers 100 and 110 and also the insulation region 60.

The source region 130 of the $n^+$ conduction type, which is an implantation region, is provided in he second layer 30 in the periphery of the trench 140. The source region 130 is short-circuited with the first layer 20 and the substrate 10 by a conductive layer 120 in the form of a silicide layer provided in the lower region of the trench.

FIG. 1 shows two such transistors, the right-hand transistor having a gate 90 which is connected or wired toward the outside to the right, and the left-hand transistor having a gate 90 which is connected or wired toward the back (third dimension) by a transverse trench (not illustrated).

FIGS. 2a–e are schematic illustrations of the essential method steps for fabricating the semiconductor component according to FIG. 1.

In accordance with FIG. 2a, the $n^+$-type substrate 10 is provided, and then the following are formed epitaxially: the first layer 20 of the conduction type p⁺ on the substrate 10, the second layer 30 of the conduction type p on the first layer 20, and the third layer 40 of the conduction type n on the second layer 30.

On top of this an oxide 45 is deposited and a trench 140 is formed, said trench reaching down to the second layer 20. The latter process is performed by forming a photomask on the oxide 45 and anisotropically etching the oxide 45 (hard mask) and the trench. A screen oxide 48 is subsequently formed in the trench 140. Afterward, the source region 130 of the conduction type n⁺ is implanted and diffused in the lower part of the second layer 30 in the periphery of the trench 140.

By means of further anisotropic etching, the trench 140 is then deepened down to the substrate 10, as illustrated in FIG. 2b.

The next step is that, in accordance with FIG. 2c, the source region 130 is short-circuited with the first layer 20 and the substrate 10 by forming the conductive layer 120 in the lower region of the trench. For this purpose, a metal, e.g. tungsten, is formed by conformal deposition in the trench and, in the loser region where it lies on the silicon (that is to say below the remaining screen oxide 48), is converted into the conductive layer 120 made of silicide by means of a thermal reaction. The residual metal situated on oxide is removed by subsequent etching.

In accordance with FIG. 2d, oxide 110 is then deposited, an auxiliary layer 55 is applied, and the auxiliary layer 55 is etched back.

Figure 2E:
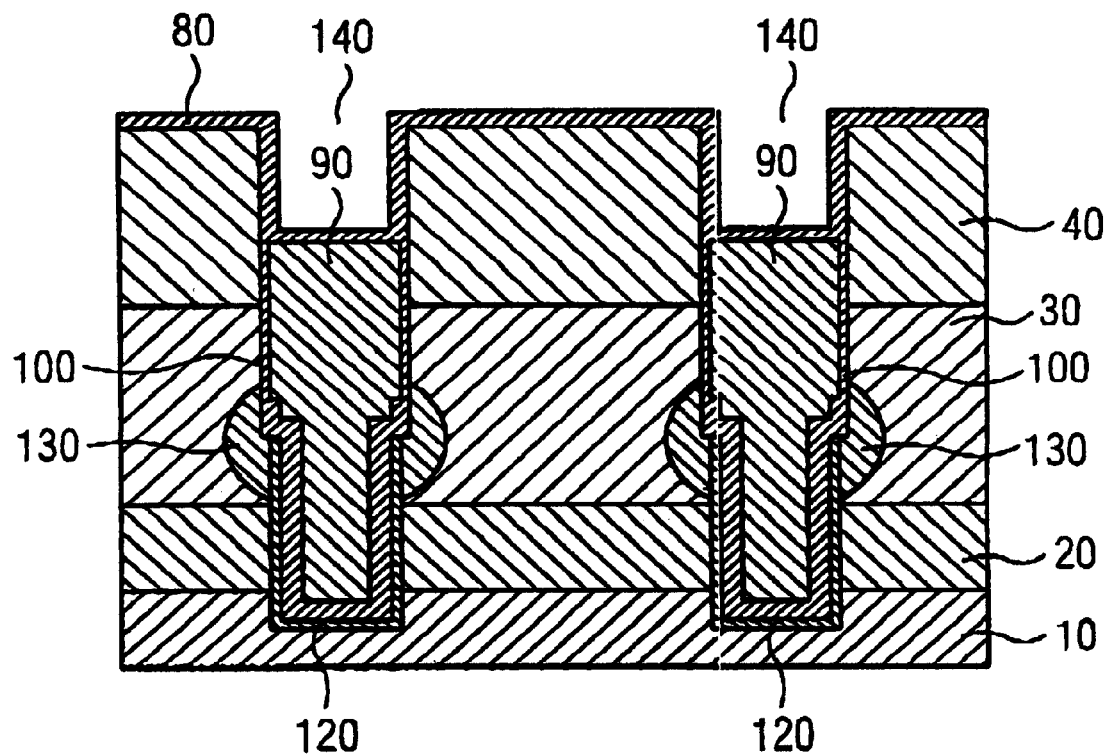

As shown in FIG. 2e, the oxide 110 is etched in the region above the remaining auxiliary layer 55 and a gate oxide 100 is formed. The auxiliary layer 55 is then removed and gate polysilicon is deposited over the resulting structure. The gate polysilicon is doped, if appropriate, and then etched back.

Then, if necessary for insulation purposes, a thicker oxide 80 is formed analogously to the oxide 110 in the upper region of the trench, thermally or by deposition.

In order to arrive at the structure of FIG. 1, the oxide 80 is then etched anisotropically in order to remove it from the top side of the gate polysilicon 90, and renewed deposition, doping and etching-back of further gate polysilicon 90 then take place. Finally, the insulation region 60 is formed on the top side of the trench using borophosphorus silicate glass (BPSG). Using a mask, contact holes for the drain terminal are formed and the drain contact 70 is implanted in a self-aligning aligning manner. Finally, the metal plane for the drain terminal 50 is formed in order to complete the transistor.

Although the present invention has been described above using preferred exemplary embodiments, it is not restricted thereto but rather can be modified in diverse ways.

In particular, in a further preferred embodiment, the body is not realized by an epitaxial layer but by p-type implantation into the bottom of the trench and outdiffusion prior to the source implantation.

Moreover, the present invention is not restricted to the transistor portrayed, but rather can be applied to some other more complicated structure, e.g. a thyristor structure.

Furthermore, the body terminal region is not absolutely necessary, rather it is also possible to connect the body region directly.

What is claimed is:

1. A semiconductor component having:

a substrate of a first conduction type;

a first layer of a second conduction type on the substrate as a body connection region;

provided on the first layer or the substrate, a second layer of the second conduction type as body region;

provided on the second layer, a third layer of the first conduction type as drain region;

a trench reaching down to the substrate from the drain region;

a gate structure provided in the trench; and a source region of the first conduction type, said source region being provided in the second layer in the periphery of the trench;

the source region being short-circuited with the first layer and the substrate by a conductive layer provided in the lower region of the trench.

2. The semiconductor component as claimed in claim 1, wherein at least one of the first, second and third layers is an epitaxial layer.

3. The semiconductor component as claimed in claim 1, wherein the source region is an implantation region.

4. The semiconductor component as claimed in claim 1, wherein the conductive layer is a silicide layer.

5. The semiconductor component as claimed in claim 1, wherein the first conduction type is an n⁺ conduction type.

* * * * *